(12) United States Patent
Jung et al.

(10) Patent No.: US 10,163,478 B2
(45) Date of Patent: Dec. 25, 2018

(54) MAGNETIC MEMORY DEVICES HAVING MEMORY CELLS AND REFERENCE CELLS WITH DIFFERENT CONFIGURATIONS

(71) Applicants: Hyunsung Jung, Hwaseong-si (KR); Daeeun Jeong, Yongin-si (KR)

(72) Inventors: Hyunsung Jung, Hwaseong-si (KR); Daeeun Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/603,907

(22) Filed: May 24, 2017

(65) Prior Publication Data

US 2018/0068702 A1   Mar. 8, 2018

(30) Foreign Application Priority Data

Sep. 6, 2016  (KR) .................. 10-2016-0114492

(51) Int. Cl.
   *G11C 11/16*   (2006.01)
   *H01L 43/02*   (2006.01)
   *H01L 43/08*   (2006.01)
   *H01L 43/10*   (2006.01)

(52) U.S. Cl.
   CPC ........ *G11C 11/1673* (2013.01); *G11C 11/161* (2013.01); *H01L 43/02* (2013.01); *H01L 43/08* (2013.01); *H01L 43/10* (2013.01)

(58) Field of Classification Search
   CPC ... G11C 11/16; G11C 11/161; G11C 11/1673; G11C 5/147; G11C 7/14; G11C 2211/5634
   See application file for complete search history.

(56) References Cited

U.S. PATENT DOCUMENTS

| | | | | |
|---|---|---|---|---|
| 6,856,537 B2* | 2/2005 | Tanizaki | ................. | G11C 11/16 365/158 |
| 7,286,429 B1* | 10/2007 | Liaw | ....................... | G11C 7/02 365/158 |
| 8,159,872 B2 | 4/2012 | Fukami et al. | | |
| 8,576,617 B2* | 11/2013 | Zhu | ......................... | G11C 11/16 365/158 |
| 8,665,638 B2 | 3/2014 | Rao et al. | | |

(Continued)

FOREIGN PATENT DOCUMENTS

| JP | 2006210396 | 8/2006 |
|---|---|---|
| JP | 5911106 | 4/2016 |

*Primary Examiner* — Vanthu T Nguyen
(74) *Attorney, Agent, or Firm* — Ward and Smith, P.A.

(57) ABSTRACT

A semiconductor memory device includes a memory cell including a memory magnetic tunnel junction (MTJ) configured to be coupled to a first sensing node and a reference cell including a first resistance element and a second resistance element configured to be coupled in parallel to a second sensing node, the first resistance element including a first number of reference MTJs and the second resistance element including a second number of reference MTJs different from the first number of reference MTJs. The memory device further includes a sensing circuit configured to be coupled to the first and second sensing nodes and to detect a difference in resistance between the memory cell and the reference cell. In some embodiments, the first number of reference MTJs includes first reference MTJs connected in series and the second number of reference MTJs includes second reference MTJs connected in series.

7 Claims, 18 Drawing Sheets

(56) References Cited

U.S. PATENT DOCUMENTS

| | | |
|---|---|---|
| 8,687,412 B2 | 4/2014 | Chih et al. |
| 8,962,493 B2 | 2/2015 | Levi et al. |
| 9,177,628 B2 | 11/2015 | Kawahara et al. |
| 9,281,039 B2 | 3/2016 | Jung et al. |
| 9,324,404 B2 | 4/2016 | Rao et al. |
| 2010/0302838 A1 | 12/2010 | Wang et al. |
| 2015/0263267 A1* | 9/2015 | Kanaya ............... H01L 43/08 257/421 |

* cited by examiner

MAGNETIC MEMORY DEVICES HAVING MEMORY CELLS AND REFERENCE CELLS WITH DIFFERENT CONFIGURATIONS

CROSS-REFERENCE TO RELATED APPLICATIONS

This U.S. nonprovisional patent application claims priority under 35 U.S.C § 119 of Korean Patent Application 10-2016-0114492 filed on Sep. 6, 2016 entire contents of which are hereby incorporated by reference.

BACKGROUND

The disclosure relates to semiconductor memory devices and, more particularly, to semiconductor memory devices including magnetic tunnel junctions (MTJs).

There is a demand for high density, lower power consumption, and nonvolatile memory devices with the development of portable computing devices and wireless communication devices. Magnetic memory devices have become one of the main candidates to satisfy such demands.

In particular, a magnetic tunnel junction (MTJ) exhibits a tunnel magneto resistance (TMR) effect, which is useful as a data storing mechanism for magnetic memory devices. A recently reported TMR ratio of several hundred for an MTJ has spurred intensive development of magnetic memory devices including such MTJs.

SUMMARY

Embodiments of the disclosure can provide a semiconductor memory device having enhanced electrical characteristics.

According to exemplary embodiments of the present inventive concept, a semiconductor memory device includes a memory cell including a memory magnetic tunnel junction (MTJ) configured to be coupled to a first sensing node and a reference cell including a first resistance element and a second resistance element configured to be coupled in parallel to a second sensing node. The first resistance element includes a first number of reference MTJs and the second resistance element includes a second number of reference MTJs different from the first number of reference MTJs. The memory device further includes a sensing circuit configured to be coupled to the first and second sensing nodes and to detect a difference in resistance between the memory cell and the reference cell. In some embodiments, the first number of reference MTJs includes first reference MTJs connected in series and the second number of reference MTJs includes second reference MTJs connected in series.

Further embodiments provide a semiconductor memory device including a memory cell configured to be coupled to a first sensing node and including a memory MTJ programmable to first and second resistance states. A reference cell is configured to be coupled to a second sensing node and including a first resistance element and a second resistance element configured to be connected in parallel. The first resistance element includes a first reference MTJ having the second resistance state and the second resistance element includes second and third MTJs connected in series and each having the second resistance state. The memory device further includes a sensing circuit configured to be coupled to the first and second sensing nodes and to detect a difference in resistance between the memory cell and the reference cell.

Still further embodiments provide a memory device including a memory cell including a memory MTJ programmable to a first resistance and a second resistance, a reference cell including at least two parallel-connected reference MTJs configured to provide a third resistance greater than the first resistance and less than the second resistance and a sensing circuit configured to determine a difference in resistance between the memory MTJ and the at least two parallel-connected reference MTJs. In some embodiments, the memory MTJ and the at least two reference MTJs may each have substantially the same structure and size. The reference cell may include a first number of first reference MTJs coupled in parallel with a second number of second reference MTJs different than the first number of MTJs.

Details of other exemplary embodiments are included in the description and drawings.

DETAILED DESCRIPTION OF EMBODIMENTS

It will be herein described in detail about a semiconductor memory device with reference to the accompanying drawings according to exemplary embodiments of the present inventive concept.

Figure 1:
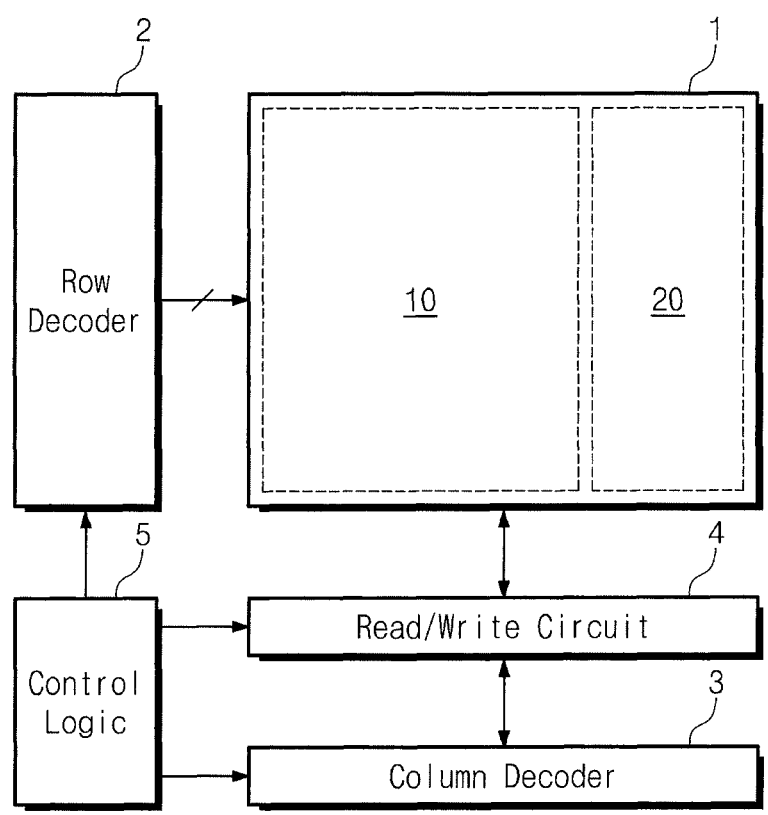
FIG. 1 is a block diagram illustrating a semiconductor memory device according to exemplary embodiments of the present inventive concept.

FIG. 1 is a block diagram illustrating a semiconductor memory device according to exemplary embodiments of the present inventive concept. Referring to FIG. 1, a semiconductor memory device may include a cell array 1, a row decoder 2, a column decoder 3, a read/write circuit 4, and a control logic 5. The cell array 1 may include a plurality of memory blocks, each of which may include a memory cell array 10 and a reference cell array 20. The memory cell array 10 may include memory cells connected to word line and bit lines, and the reference cell array 20 may include reference cells that provide a reference resistance.

The read/write circuit 4 may be connected to the cell array 1 through the bit lines. The read/write circuit 4 may select the bit line in response to a bit line selection signal (not shown) from the column decoder 3. The read/write circuit 4 may be configured to communicate with an external device. In a write operation, the read/write circuit 4 may provide a write current to a selected memory cell so that data of 1 or 0 may be written into the selected memory cell. In a read operation, the read/write circuit 4 may provide a read current to the a selected memory cell so that data may be read from the selected memory cell. The read/write circuit 4 may compare a resistance value of the reference cell with a resistance value of the memory cell selected in a read operation.

The read/write circuit 4 may operate in response to the control of the control logic 5. The read/write circuit 4 may receive power from the control logic 5 and provide the received power to the bit line.

The control logic 5 may control the overall operation of the semiconductor memory device. The control logic 5 may receive control signals and an external voltage, and be operated based on the received control signals. The control logic 5 may use an external voltage to produce power required for an internal operation. The control logic 5 may control read, write, and/or erase operations in response to the control signals.

Figure 2:
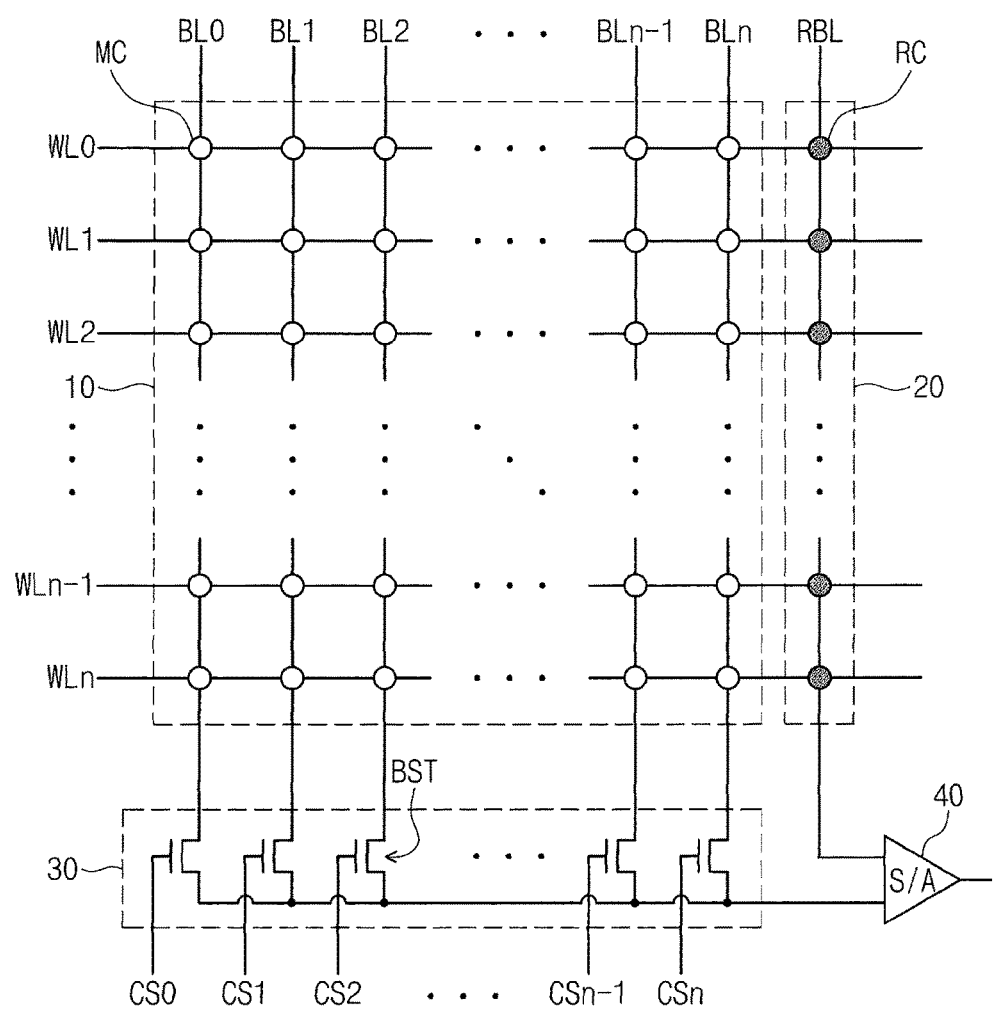
FIG. 2 is a circuit diagram illustrating a semiconductor memory device according to exemplary embodiments of the present inventive concept.

FIG. 2 is a circuit diagram illustrating a semiconductor memory device according to exemplary embodiments of the present inventive concept. Referring to FIG. 2, the cell array 1 may include the memory cell array 10 and the reference cell array 20.

The memory cell array 10 may include memory cells MC arranged along rows and column, and the reference cell array 20 may include reference cells RC arranged along a column direction. Although the reference cell array 20 is illustrated disposed on a side of the memory cell array 10, the reference cell array 20 may be disposed between neighboring columns of memory cells MC. It will be understood that other arrangements may be used in some embodiments.

A plurality of word lines WL0 to WLn may extend from the memory cell array 10 to the reference cell array 20. In the memory cell array 10, a plurality of bit lines BL0 to BLn may extend across the word lines WL0 to WLn. In the reference cell array 20, a plurality of reference bit lines RBL may extend across the word lines WL0 to WLn.

A plurality of memory cells MC may be connected between the word lines WL0 to WLn and the bit lines BL0 to BLn in the memory cell array 10, and a plurality of reference cells RC may be connected between the word lines WL0 to WLn and the reference bit lines RBL in the reference cell array 20. The memory cells MC may include a variable resistance element that can be switched from one to the other of its two resistance states by application of an electrical pulse, and may store data of 1 or 0 in accordance with variation in its resistance value.

The reference cells RC may provide a reference resistance for reading data stored in the memory cells MC. In some embodiments, one of the word lines WL0 to WLn may be selected to select a row of the memory cells MC and one of the reference cells RC. A select circuit 30 may be provided connected to the bit lines BL0 to BLn in the memory cell array 10, and each of the bit lines BL0 to BLn may be connected to a bit line select transistor BST for selecting one of the bit lines BL0 to BLn. The select circuit 30 may connect one of the bit lines BL0 to BLn to a sense amplifier 40 in response to column select signals CS0 to CSn.

The sense amplifier 40 may read data stored in a selected memory cell MC by amplifying a difference between a reference voltage of the reference bit line RBL and a voltage of a selected one of the bit lines BL0 to BLn. In this manner, the sense amplifier 40 may compare a resistance value of a selected memory cell MC with a resistance value of the reference cell RC, with the output of the sense amplifier indicating the difference in resistance values.

Figure 3:
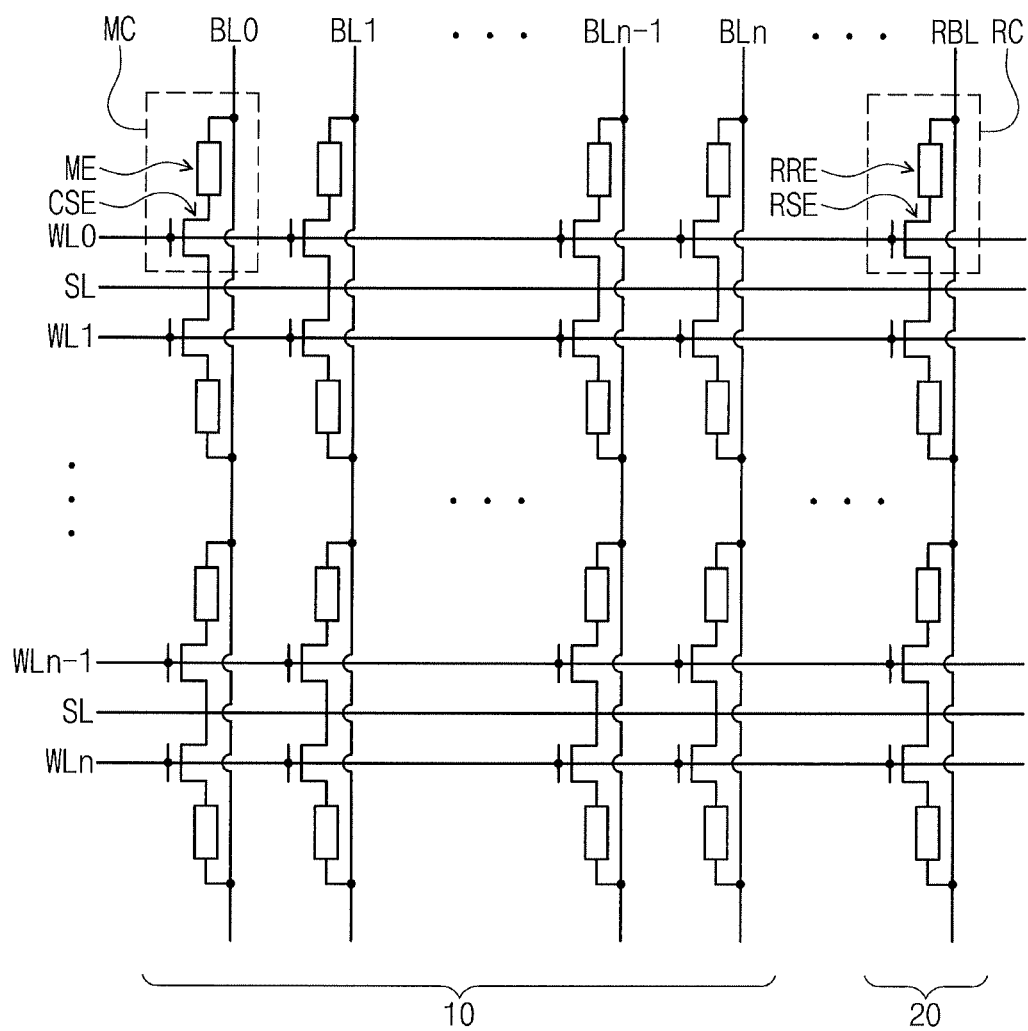
FIG. 3 is a circuit diagram illustrating a semiconductor memory device according to exemplary embodiments of the present inventive concept.

FIG. 3 is a circuit diagram illustrating a semiconductor memory device according to exemplary embodiments of the present inventive concept. Refereeing to FIG. 3, the plurality of unit memory cells MC may be two-dimensionally arranged along a plurality of rows and columns, and the reference cells RC may be arranged corresponding to each row of the memory cells MC.

Each of the memory cells MC may include a memory element ME and a cell select element CSE. The cell select element CSE and the memory element ME may be electrically connected in series. The memory element ME may be connected between the cell select element CSE and one of the bit lines BL0 to BLn, and the cell select element CSE may be disposed between the memory element ME and a source line SL. The cell select element CSE may be controlled by one of the word lines WL0 to WLn.

In some embodiments, the memory element ME may be a variable resistance element that can be switched between two resistance states by an applied electrical pulse. For example, the memory element ME may include a thin film structure having an electrical resistance that can be changed using a spin transferring phenomenon of an electrical current flowing through the memory element ME. The thin film structure may exhibit a magneto-resistance property, and may include at least one ferromagnetic material and/or at least one anti-ferromagnetic material. Configurations of the memory element ME according to exemplary embodiments of the present inventive concept will be further discussed in detail with reference to FIGS. 4A and 4B.

The cell select element CSE may control a current flow to the memory elements ME responsive to voltages of the word lines WL0 to WLn. The cell select element CSE may include, for example, a diode, a PNP bipolar transistor, an NPN bipolar transistor, an NMOS field effect transistor, and a PMOS field effect transistor. For example, if the cell select element CSE is composed of a three terminal device such as a MOS field effect transistor, the source line SL may be connected to a source electrode of the transistor. The source line SL may be disposed between adjacent word lines WL0 to WLn, and thus two transistors may share one source line SL.

The reference cells RC may be connected between the word lines WL0 to WLn and the reference bit line RBL crossing each other. Each of the reference cells RC may include a reference cell select elements RSE and a reference resistance element RRE that are connected in series. The reference resistance element RRE may be connected between the reference bit line RBL and the reference cell select element RSE, and the reference cell select element RSE may be connected between the reference resistance element RRE and the source line SL. The reference cell select element RSE may be controlled by one of the word lines WL0 to WLn.

The reference resistance element RRE may be configured to provide a reference resistance to evaluation the state of the memory elements ME. In some embodiments, the memory element ME may have one of two resistance states, i.e., a first resistance value and a second resistance value greater than the first resistance value. The reference resistance element RRE may have a reference resistance value greater than the first resistance value and less than the second resistance value.

In some embodiments, like the memory element ME, the reference resistance element RRE may include a thin film structure configured to exhibit a magneto-resistance property, and may include at least one ferromagnetic material and/or at least one anti-ferromagnetic material. The configuration of the reference resistance element RRE according to various exemplary embodiments of the present inventive concept will be further discussed in detail with reference to FIGS. 4A, 4B, and 5 to 12.

The reference cell select element RSE may provide a current to the reference resistance element RRE in accordance with voltages of the word lines WL0 to WLn. The reference cell select element RSE may have the same structure as the cell select element CSE. For example, in some embodiments, the reference cell select element RSE may be a MOS field effect transistor, and one of the word lines WL0 to WLn may be electrically connected in common to a gate electrode of the reference cell select element RSE and gate electrodes of the cell select elements CSE of the memory cells MC arranged along a row direction.

Figure 4A:
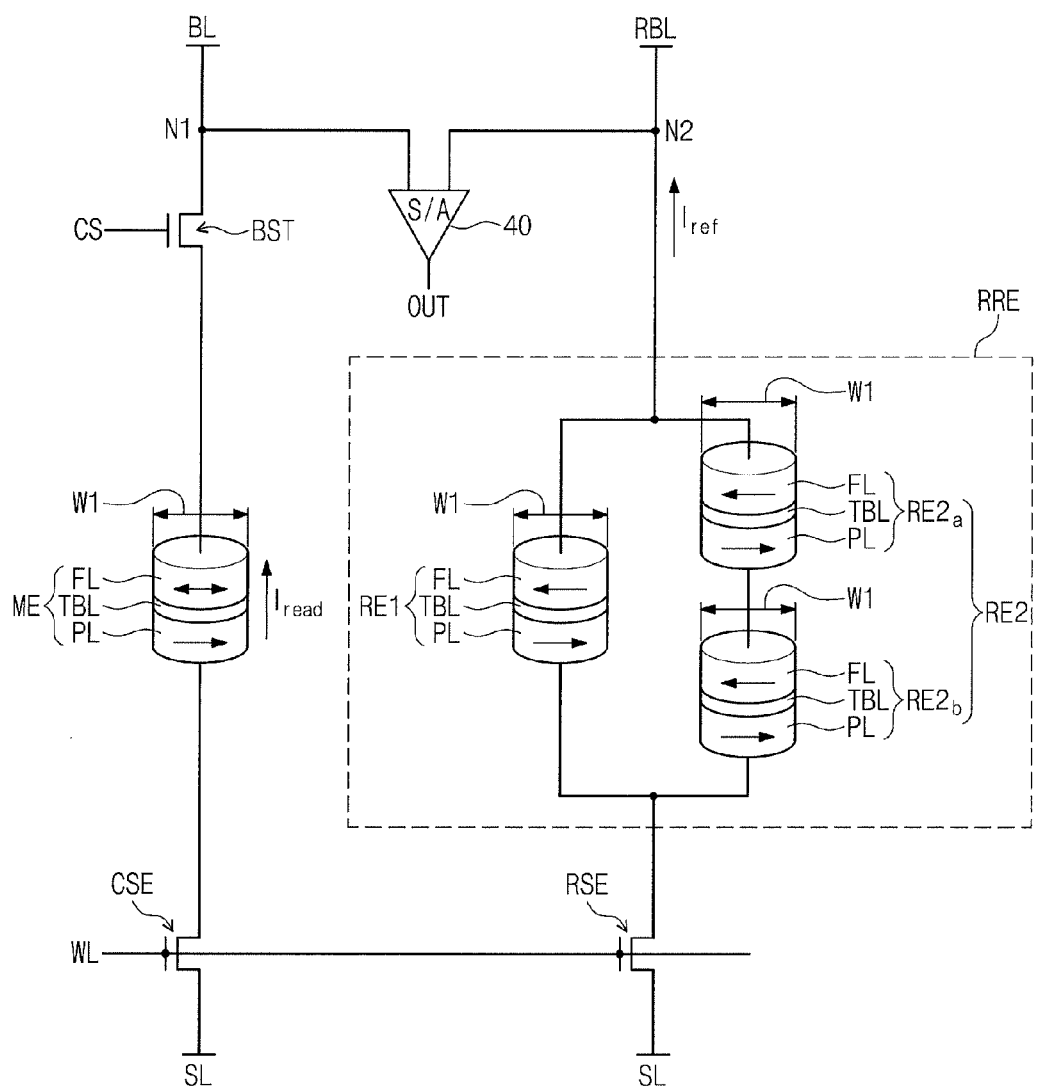
FIGS. 4A and 4B are schematic diagrams illustrating a unit memory cell and a reference cell connected to a sense amplifier according to exemplary embodiments of the present inventive concept.
Figure 4B:
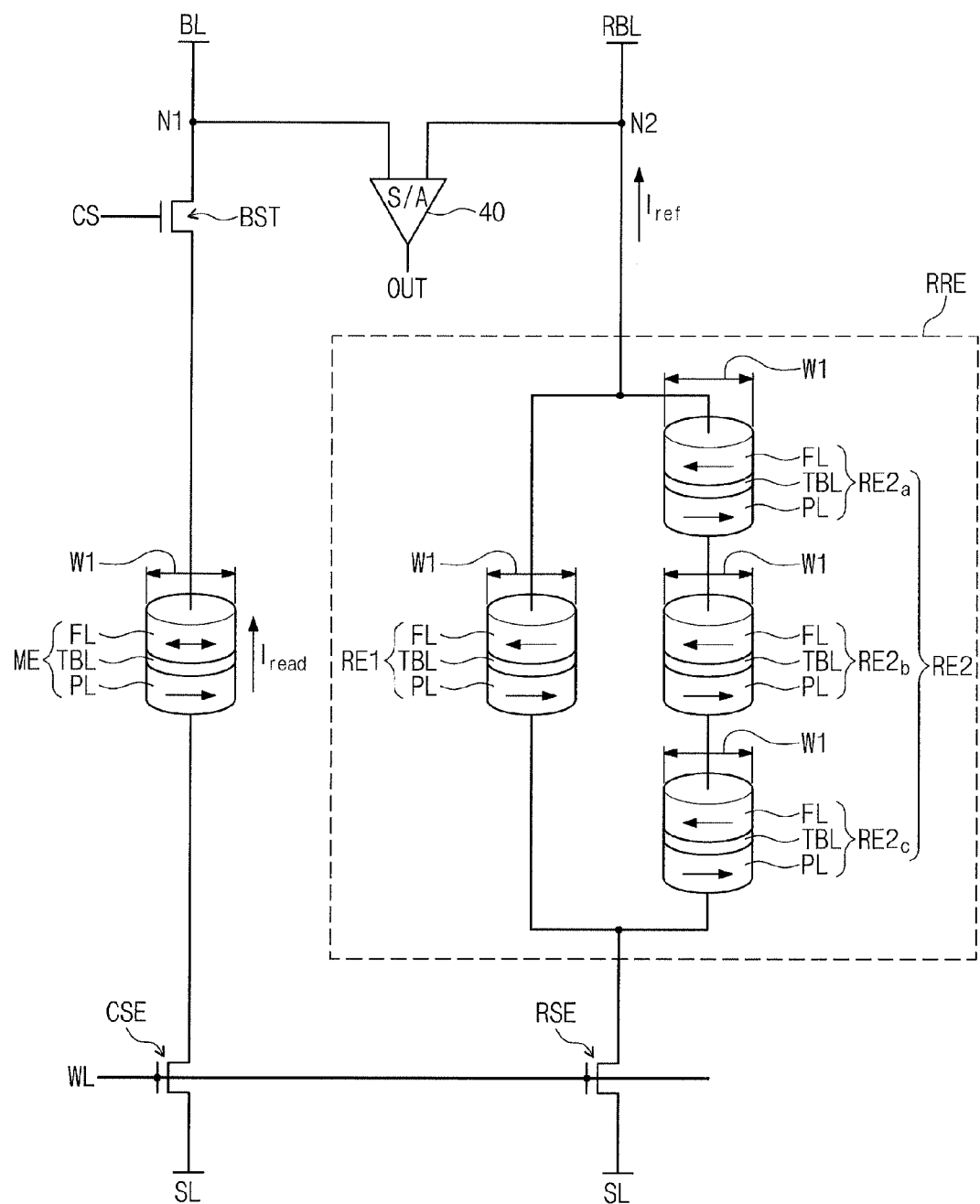

FIGS. 4A and 4B are schematic diagrams illustrating a unit memory cell and a reference cell connected to the sense amplifier 40 according to exemplary embodiments of the present inventive concept. Referring to FIGS. 4A and 4B, the memory element ME may be connected between a first sensing node N1 and the cell select element CSE, and the reference resistance element RRE may be connected between a second sensing node N2 and the reference cell select element RSE. The bit line select transistor BST may be connected between the first sensing node N1 and the memory element ME, and the first sensing node N1 may be connected to a memory cell selected in accordance with the operation of the bit line select transistor BST. The bit line select transistor BST may be controlled by the column select signals CS.

The sense amplifier 40 may be connected to the first and second sensing nodes N1 and N2. When a data read operation is executed, the sense amplifier 40 may sense, amplify, and output a difference between a voltage of the first sensing node N1 and a reference voltage of the second sensing node N2.

In some embodiments, the cell select element CSE and the reference cell select element RSE may be a MOS field effect transistor, and a single word line WL may be commonly connected to gate electrodes of the cell select element CSE and the reference cell select element RSE. A single source line SL may be electrically connected in common to source electrodes of the cell select element CSE and the reference cell select element RSE.

In some embodiments, the memory element ME may be a variable resistance element including a magnetic tunnel junction MTJ. Unless otherwise stated, the memory element ME may be interchangeably referred to as the magnetic tunnel junction MTJ. The magnetic tunnel junction ME may be connected between the cell select element CSE and the bit line BL, and the cell select element CSE may be connected between the magnetic tunnel junction ME and the source line SL. The cell select element CSE may be controlled by the word line WL.

The magnetic tunnel junction ME may include magnetic layers FL and PL and a tunnel barrier layer TBL between the magnetic layers FL and PL. One of the magnetic layers FL and PL may be a pinned layer PL whose magnetization direction is fixed regardless of an external magnetic field or a spin transfer torque (STT) under usual circumstances. The other of the magnetic layers FL and PL may be a free layer FL whose magnetization direction is freely changed by an external magnetic field or a spin transfer torque (STT). In some embodiments, the magnetic tunnel junction ME may be substantially shaped like a cylindrical or polygonal pillar, and may have a first width or diameter W1.

In some embodiments, the magnetic tunnel junction ME may have an electrical resistance that is changeable in accordance with the magnetization directions of the free layer FL and the pinned layer PL. The electrical resistance of the magnetic tunnel junction ME may be less when the magnetization directions of the pinned and free layers PL and FL are parallel than when the magnetization directions of the pinned and free layers PL and FL are anti-parallel. To put it another way, the electrical resistance of the magnetic tunnel junction ME may be greater when the magnetization directions of the pinned and free layers PL and FL are anti-parallel than when the magnetization directions of the pinned and free layers PL and FL are parallel.

In other words, the electrical resistance of the magnetic tunnel junction ME may be altered by changing the magnetization direction of the free layer FL, and this property may be used to write data of "0" or "1" in the magnetic tunnel junction ME. For example, when the magnetization directions of the free and pinned layers FL and PL are parallel, the magnetic tunnel junction may have a low resistance state (a first resistance value) and data of "0" may be written in the magnetic tunnel junction ME. On the other hand, when the magnetization directions of the free and pinned layers FL and PL are anti-parallel, the magnetic tunnel junction ME may have a high resistance state (a second resistance value greater than the first resistance value) and data of "1" may be written in the magnetic tunnel junction ME. The magnetic tunnel junction ME may have a resistance distribution in the low and high resistance states.

When first and second read currents flowing opposite directions are provided between the bit line BL and the source line SL included in a selected memory cell MC, a spin transfer torque (STT) write operation may be performed to write data in the selected memory cell MC.

In detail, the first read current may be provided to flow from the free layer FL to the pinned layer PL of the magnetic tunnel junction ME. In this case, electrons having the same spin directions as the magnetization direction of the pinned layer PL may tunnel through the tunnel barrier layer TBL to apply torque to the free layer FL. Therefore, in the magnetic tunnel junction ME, the magnetization direction of the free layer FL may be changed parallel (AP→P) to the magnetization direction of the pinned layer PL.

Alternatively, the second read current may be provided to flow from the pinned layer PL to the free layer FL of the magnetic tunnel junction ME. In this case, electrons having opposite spin directions to the magnetization direction of the pinned layer PL may not tunnel through the tunnel barrier layer TBL, but may reflect back on the free layer FL to apply torque to the free layer FL. Therefore, in the magnetic tunnel junction ME, the magnetization direction of the free layer FL may be changed anti-parallel (P→AP) to the magnetization direction of the pinned layer PL.

In some embodiments, the reference resistance element RRE may have a reference resistance value, which may be greater than the first resistance value of the memory element ME and less than the second resistance value of the memory element ME. In some embodiments, the reference resistance element RRE may be composed of at least one reference magnetic tunnel junction (reference MTJ). The reference MTJ may include a pinned layer PL, a free layer FL, and a tunnel barrier layer TBL therebetween, and may have the same stack structure as the magnetic tunnel junction of the memory element ME. Unlike the memory element ME of which the free layer FL has the changeable magnetization direction, the pinned and free layers PL and FL of the reference MTJ may have magnetization directions that are fixed anti-parallel to each other when the reference MTJ is once provided with a write current or an external magnetic field.

In some embodiments, as shown in FIGS. 4A and 4B, the reference resistance element RRE may include a first resistance element RE1 and a second resistance element RE2 that are connected in parallel between the reference cell select element RSE and the reference bit line BL (or the second sensing node N2). The first and second resistance elements RE1 and RE2 may have resistance values different from each other.

In some embodiments, each of the first and second resistance elements RE1 and RE2 may include at least one reference MTJ whose structural configuration is the same as that of the magnetic tunnel junction of the memory element ME. For example, if the magnetic tunnel junction of the memory element ME has the first width or diameter W1, the reference MTJs of the first and second resistance elements RE1 and RE2 may have substantially the same size, i.e., substantially the same width or diameter W1. In other words, each of the reference MTJs of the first and second resistance elements RE1 and RE2 may have substantially the same TMR characteristics as the magnetic tunnel junction of the memory element ME. Furthermore, in each of the first and second resistance elements RE1 and RE2, the pinned and free layers PL and FL of each of the reference MTJs may be fixed anti-parallel to each other.

In some embodiments, the first resistance element RE1 may include n first reference MTJs RE1 that are connected in series between the second sensing node N2 and the reference cell select element RSE, and the second resistance element RE2 may include m second reference MTJs RE2a and RE2b that are connected in series between the second sensing node N2 and the reference cell select element RSE. Unless otherwise stated, the first (or second) resistance element may be interchangeably referred to as the first (or second) reference MTJ. Herein, n and m are different natural numbers equal to or greater than 1. That is, the number of the first reference MTJs constituting the first resistance element RE1 may be different from the number of the second reference MTJs RE2a and RE2b constituting the second resistance element RE2.

In some embodiments, the number of the first and second reference MTJs constituting the first and second resistance elements RE1 and RE2 may be changed depending on TMR characteristics and a size of the magnetic tunnel junction of the memory element ME. For example, the first reference MTJs RE1 may have substantially the same resistance value as the second reference MTJs RE2a and RE2b. As the first and second reference MTJs RE1, RE2a and RE2b are in an anti-parallel state, the resistance values of the first and second reference MTJs RE1, RE2a and RE2b may be substantially the same as the second resistance value (high resistance value) of the magnetic tunnel junction of the memory element ME. In the embodiments illustrated in FIGS. 4A and 4B, the resistance value of the second resistance element RE2 may be greater than that of the first resistance element RE1, and the first and second resistance elements RE1 and RE2 are connected in parallel, with the result that the reference resistance value may be greater than the first resistance value and less than the second resistance value of the memory element ME.

In the embodiment illustrated in FIG. 4A, the first resistance element RE1 may be composed of a single first reference MTJ, and the second resistance element RE2 may be composed of two second reference MTJs RE2a and RE2b that are connected in series. Alternatively, in the embodiment illustrated in FIG. 4B, the first resistance element RE1 may be composed of a single first reference MTJ, and the second resistance element RE2 may be composed of three second reference MTJs RE2a, RE2b and RE2c that are connected in series. In some embodiments, the first resistance element RE1 may be composed of two first reference MTJs that are connected in series, and the second resistance element RE2 may be composed of four second reference MTJs that are connected in series.

In order to read data from a selected memory cell, a selected word line WL may be applied with a turn-on voltage, the bit lines BL may be applied with read voltages, and a selected source line SL may be applied with a source line voltage. Under the condition above, a read current $I_{read}$ may be provided to the magnetic tunnel junction ME of the selected memory cell, and a reference current $I_{ref}$ may be provided to the reference resistance element RRE of the reference cell. Herein, in order not to change the magnetization of the free layer FL of the magnetic tunnel junction ME, the read current $I_{read}$ may be less than first and second write currents provided to the memory cell. The read current $I_{read}$ may be altered depending on the resistance value of the magnetic tunnel junction ME of the selected memory cell.

In some embodiments, the sense amplifier 40 may configured to allow the reference current Iref, flowing through the reference resistance element RRE, to flow from the pinned layers PL to the free layers FL of the reference MTJs RE1, RE2a and RE2b. The reference current $I_{ref}$ may therefore be prohibited from changing the magnetization directions of the free layers FL of the reference MTJs RE1, RE2a and RE2b. In conclusion, as the reference current $I_{ref}$ has no effect on changing the resistance values of the reference MTJs RE1, RE2a and RE2b, a stable reference resistance value may be provided when a data read operation is executed.

In some embodiments, the reference resistance value of the reference resistance element RRE may be greater than the first resistance value (low resistance value) of the magnetic tunnel junction ME and less than the second resistance value (high resistance value) of the magnetic tunnel junction ME. Therefore, in a read operation, the reference current $I_{ref}$ may be greater or less than the read current $I_{read}$ flowing through a selected memory cell. Consequently, the sense amplifier 40 may compare difference between the read current $I_{read}$ and the reference current $I_{ref}$, and may then read data stored in a selected memory cell in accordance with the difference between the read current Iread and the reference current $I_{ref}$.

Figure 5:
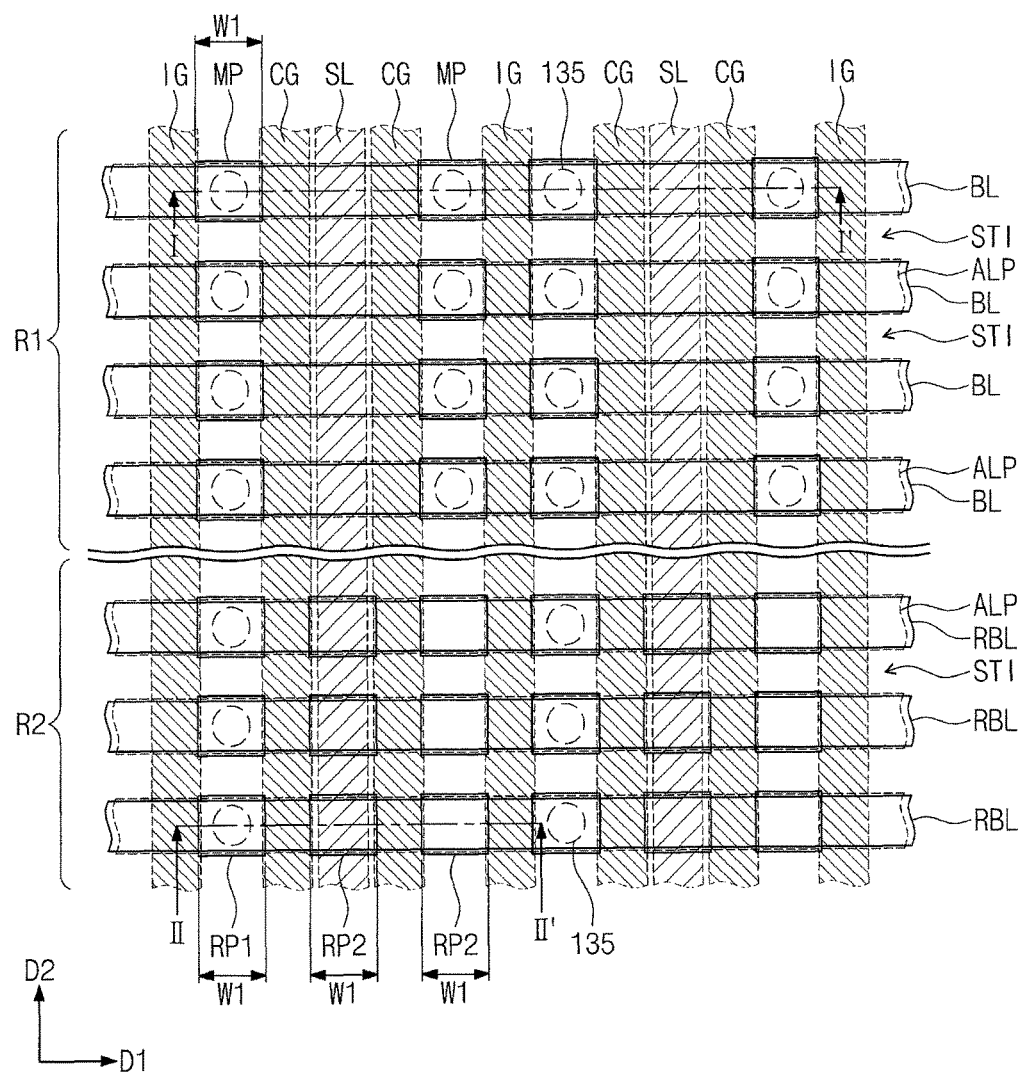
FIG. 5 is a plan view illustrating a semiconductor memory device according to exemplary embodiments of the present inventive concept.
Figure 6:
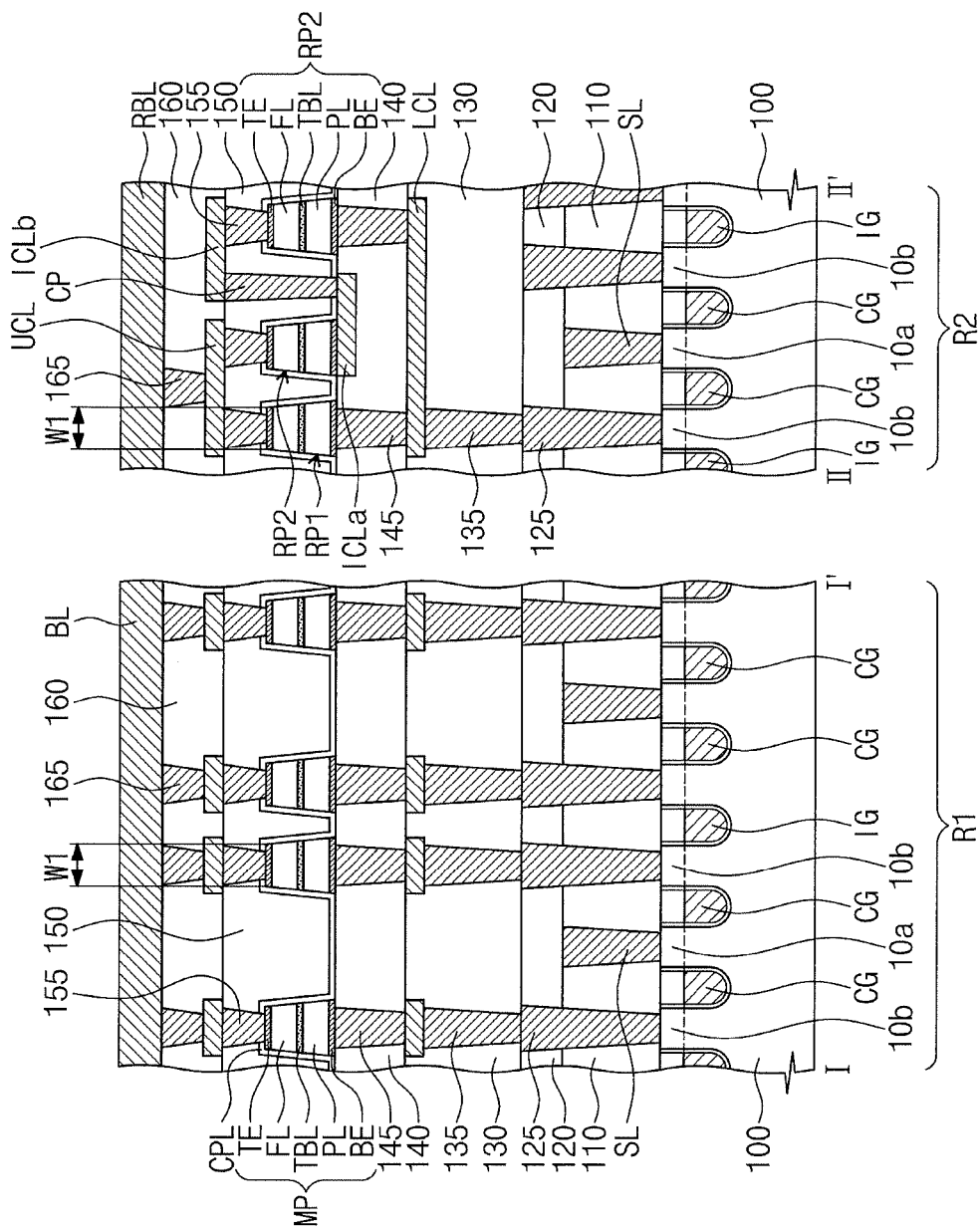
FIG. 6 is a cross-sectional view taken along lines I-I' and II-II' of FIG. 5 illustrating a semiconductor memory device according to exemplary embodiments of the present inventive concept.

FIG. 5 is a plan view illustrating a semiconductor memory device according to exemplary embodiments of the present inventive concept. FIG. 6 is a cross-sectional view taken along lines I-I' and II-II' of FIG. 5 illustrating a semiconductor memory device according to exemplary embodiments of the present inventive concept.

Referring to FIGS. 5 and 6, a semiconductor substrate 100 may be provided to include a memory cell array region R1 and a reference cell array region R2. The semiconductor substrate 100 may be provided therein with device isolation patterns STI defining active line patterns ALP. The semiconductor substrate 100 may be a silicon substrate, a germanium substrate, and/or a silicon-germanium substrate. Each of the active line patterns ALP may be defined between the device isolation patterns STI adjacent to each other. In some embodiments, the active line patterns ALP may have a linear shape extending in a first direction D1, and may be arranged spaced apart from each other in a second direction D2 perpendicular to the first direction D1. The active line patterns ALP may be doped with first conductive impurities.

The semiconductor substrate 100 may have therein cell gate electrodes CG (i.e., word lines) and isolation gate electrodes IG, all of which may run across the active line patterns ALP and the device isolation patterns STI. In some embodiments, the cell gate electrodes CG and the isolation gate electrodes IG may extend from the memory cell array region R1 to the reference cell array region R2.

In some embodiments, the cell gate electrodes CG and the isolation gate electrodes IG may have top surfaces positioned lower than a top surface of the semiconductor substrate 100. The cell gate electrodes CG and the isolation gate electrodes IG may have a linear shape that extends in the second direction D2 running across the active line patterns ALP. A gate hardmask pattern composed of an insulating material may be disposed on each of the cell and isolation gate electrodes CG and IG. The gate hardmask patterns may have top surfaces substantially coplanar with the top surface of the semiconductor substrate 100. The isolation gate electrode IG may be formed of the same material as the cell gate electrode CG.

A gate dielectric layer GI may be disposed between the cell gate electrode CG and the semiconductor substrate 100 and between the isolation gate electrode IG and the semiconductor substrate 100. The gate dielectric layer GI may include oxide (e.g., silicon oxide), nitride (e.g., silicon nitride), oxynitride (e.g., silicon oxynitride), and/or high-k dielectric (e.g., insulating metal oxide such as hafnium oxide or aluminum oxide).

When a semiconductor memory device is operated, an isolation voltage may be applied to each of the isolation gate electrodes IG. The isolation voltage may prevent channel formation below the isolation gate electrode IG. Accordingly, adjacent memory cells may be electrically separated from each other. For example, when the active line pattern ALP is doped with a p-type dopant, the isolation voltage may be a ground voltage or a negative voltage.

A first impurity region 10a may be disposed in the active line pattern ALP on one side of each of the cell gate electrodes CG, and a second impurity region 100b may be disposed in the active line pattern ALP on an opposite side of each of the cell gate electrodes CG. In some embodiments, the first impurity region 10a may be disposed in the active line pattern ALP between a pair of the cell gate electrodes CG, and a pair of the second impurity regions 100b may be disposed in the active line patterns ALP across the pair of the cell gate electrodes CG. As a result, a pair of select transistors may share the first impurity region 10a. The first and second impurity regions 10a and 100b may be doped with a second conductivity dopant different from the first conductivity dopant of the active line patterns ALP. One of the first and second conductivity dopants may be an n-type conductivity dopant, and the other of the first and second conductivity dopants may be a p-type conductivity dopant.

In some embodiments, the first and second impurity regions 10a and 100b may correspond to source/drain regions of cell or reference cell select transistors. In other words, the cell gate electrodes CG and the first and second impurity regions 10a and 100b formed on the semiconductor substrate 100 may constitute cell or reference cell select transistors of a semiconductor memory device.

Source lines SL may be formed in a first interlayer dielectric layer 110 covering an entire surface of the semiconductor substrate 100, and may extend parallel to each other in the second direction D2. In some embodiments, the source lines SL may extend from the memory cell array region R1 to the reference cell array region R2. As viewed in plan, each of the source lines SL may be disposed between the cell gate electrodes CG adjacent to each other. Each of the source lines SL may be electrically connected to the first impurity regions 10a arranged along the second direction D2. The source line SL may have a top surface substantially coplanar with a top surface of the first interlayer dielectric layer 110.

The first interlayer dielectric layer 110 may be provided on its entire surface with an etch stop layer (not shown) coving the top surfaces of the source lines SL included in the first interlayer dielectric layer 110, and a second interlayer dielectric layer 120 may be disposed on the first interlayer dielectric layer 110.

Buried contact plugs 125 may be provided to penetrate the first and second interlayer dielectric layers 110 and 120, and each of the buried contact plugs 125 may be coupled to each of the second impurity regions 10b. In some embodiments, the buried contact plugs 125 may have top surfaces positioned higher than the top surfaces of the source lines SL.

Third and fourth interlayer dielectric layers 130 and 140 may be stacked on the buried contact plugs 125. On the cell array region R1, the third interlayer dielectric layer 130 may be provided therethrough with first lower contact plugs 135 each of which is electrically connected to each of the buried contact plugs 125, and the fourth interlayer dielectric layer 140 may be provided therethrough with second lower contact plugs 145 each of which is electrically connected to each of the first lower contact plugs 135. As not shown in figures, a plurality of insulating layers, contact plugs, and interconnect lines may be further included between the first lower contact plugs 135 and the buried contact plugs 125.

In some embodiments, memory MTJ patterns MP may be disposed on the fourth interlayer dielectric layer 140 of the memory cell array region R1, and on the memory cell array region R1, each of the memory MTJ patterns MP may be electrically connected to each of the second lower contact plugs 145. Each of the memory MTJ patterns MP may include a pinned layer PL, a free layer FL, and a tunnel barrier layer TBL therebetween. In addition, each of the memory MTJ patterns MP may further include a bottom electrode BE below the pinned layer PL and a top electrode TE above the free layer FL.

In some embodiments, a reference resistance structure may be disposed on the fourth interlayer dielectric layer 140 of the reference cell array region R2. The reference resistance structure may include a first reference MTJ pattern RP1 and second reference MTJ patterns RP2. In some embodiments, the first and second reference MTJ patterns RP1 and RP2 may have the same stack structure as the memory MTJ patterns MP. In detail, each of the first and second reference MTJ patterns RP1 and RP2 may include a pinned layer PL, a free layer FL, and a tunnel barrier layer TBL therebetween. In addition, each of the first and second reference MTJ patterns RP1 and RP2 may further include a bottom electrode BE below the pinned layer PL and a top electrode TE above the free layer FL.

In some embodiments, the bottom electrode BE of one of the second reference MTJ patterns RP2 may be electrically connected to the top electrode TE of an adjacent one of the second reference MTJ patterns RP2 through a lower line ICLa, an upper line ICLb, and an interconnect plug CP.

The bottom electrode BE of the first reference MTJ pattern RP1 may be electrically connected to the bottom electrode BE of the second reference MTJ pattern RP2 through a lower interconnect line LCL and the second lower contact plugs 145. The top electrode TE of the first reference MTJ pattern RP1 may be electrically connected to the top electrode TE of an adjacent one of the second reference MTJ patterns RP2 through an upper interconnect line UCL and upper contact plugs 155.

In some embodiments, each of the MTJ patterns MP, RP1 and RP2 may have an upper width less than its lower width. In this case, each of the MTJ patterns MP, RP1 and RP2 may have a substantially trapezoidal cross-section. Each of the first and second reference MTJ patterns RP1 and RP2 may have an upper width W1 the same as those of the memory MTJ patterns MP.

The memory MTJ patterns MP may be covered with interlayer dielectric layers 150 and 160 stacked on the fourth dielectric layer 140 of the cell array region R1 and the reference cell array region R2. The capping insulation layer CPL may be provided to conformally cover the memory MTJ patterns MP, the first reference MTJ pattern RP1, and the second reference MTJ patterns RP2.

Bit lines BL may be provided electrically connected to the memory MTJ patterns MP arranged along the first direction D1 on the cell array region R1. As viewed in plan, each of the bit lines BL may overlap each of the active line patterns ALP. The bit lines BL may be coupled through the upper contact plugs 155 to the top electrodes TE of the memory MTJ patterns MP, or may be in direct contact with the top electrodes TE of the memory MTJ patterns MP.

Reference bit lines RBL may be provided electrically connected to the reference MTJ patterns RP1 and RP2 arranged along the first direction D1 on the reference cell array region R2. The reference bit lines RBL may be coupled through the upper contact plugs 155 to the upper interconnect line UCL electrically connected to the reference MTJ patterns RP1 and RP2.

Figure 7:
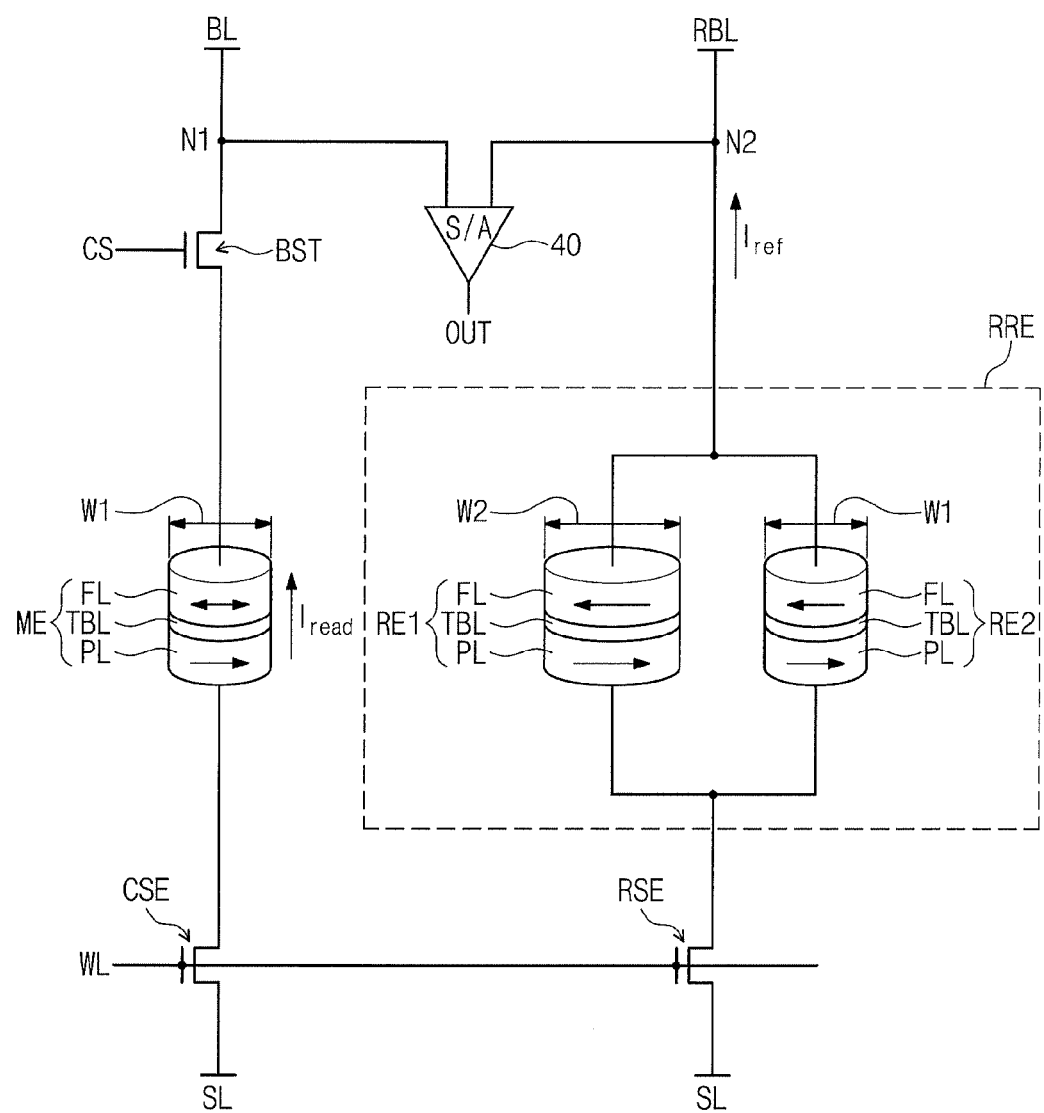
FIG. 7 is a schematic diagram illustrating a unit memory cell and a reference cell connected to a sense amplifier according to exemplary embodiments of the present inventive concept.

FIG. 7 is a schematic diagram illustrating a unit memory cell and a reference cell connected to the sense amplifier 40 according to exemplary embodiments of the present inventive concept. For brevity of the description, components substantially the same as those discussed above with reference to FIGS. 4A and 4B are allocated the same reference numerals thereto, and a repetitive description thereof will be omitted.

Referring to FIG. 7, the memory element ME may be connected between the first sensing node N1 and the cell select element CSE, and the reference resistance element RRE may be connected between the second sensing node N2 and the reference cell select element RSE.

The memory element ME may be connected through the first sensing node N1 to the sense amplifier 40 in accordance with the bit line select signal CS. As discussed above, the memory element ME may be a variable resistance element that includes the magnetic tunnel junction having a first width or diameter W1. The magnetic tunnel junction of the memory element ME may have a first resistance value or a second resistance value greater than the first resistance value.

For example, the reference resistance element RRE may include a first reference MTJ RE1 and a second reference MTJ RE2 that are connected in parallel. Each of the first and second reference MTJs RE1 and RE2 may include the free layer FL and the pinned layer PL whose magnetization directions are fixed anti-parallel to each other. The first and second reference MTJs RE1 and RE2 may have resistance values different from each other.

The first reference MTJ RE1 may have a second width W2 greater than the first width W1 of the magnetic tunnel junction of the memory element ME, and the second reference MTJ RE2 may have a first width W1 substantially the same as that of the magnetic tunnel junction of the memory element ME. Accordingly, the first and second reference MTJs RE1 and RE2 may have different resistance values from each other due to their different sizes. In some embodiments, the resistance value of the first reference MTJ RE1 may be less than that of the second reference MTJ RE2, and the first and second reference MTJs RE1 and RE2 may be connected in parallel, with the result that the reference resistance element RRE may have a reference resistance value greater than the first resistance value of the memory element ME and less than the second resistance value of the memory element ME.

Figure 8:
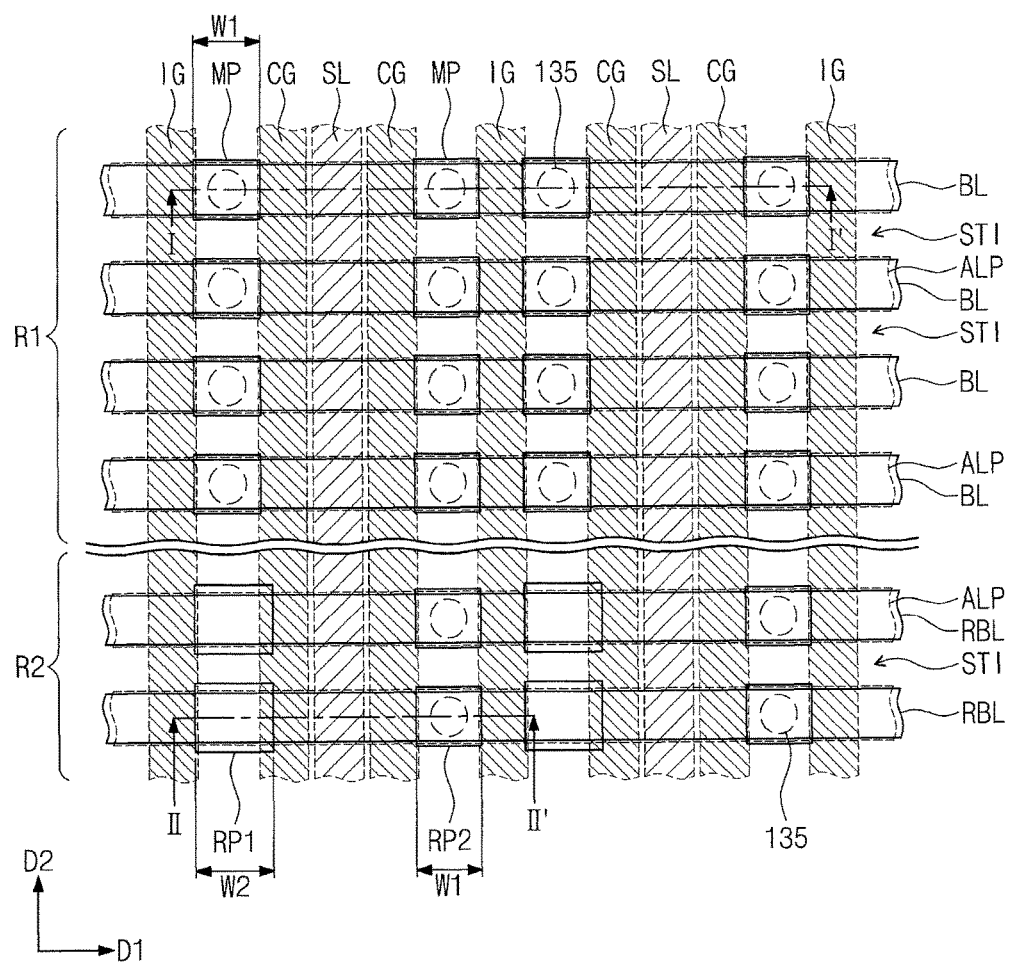
FIG. 8 is a plan view illustrating a semiconductor memory device according to exemplary embodiments of the present inventive concept.
Figure 9:
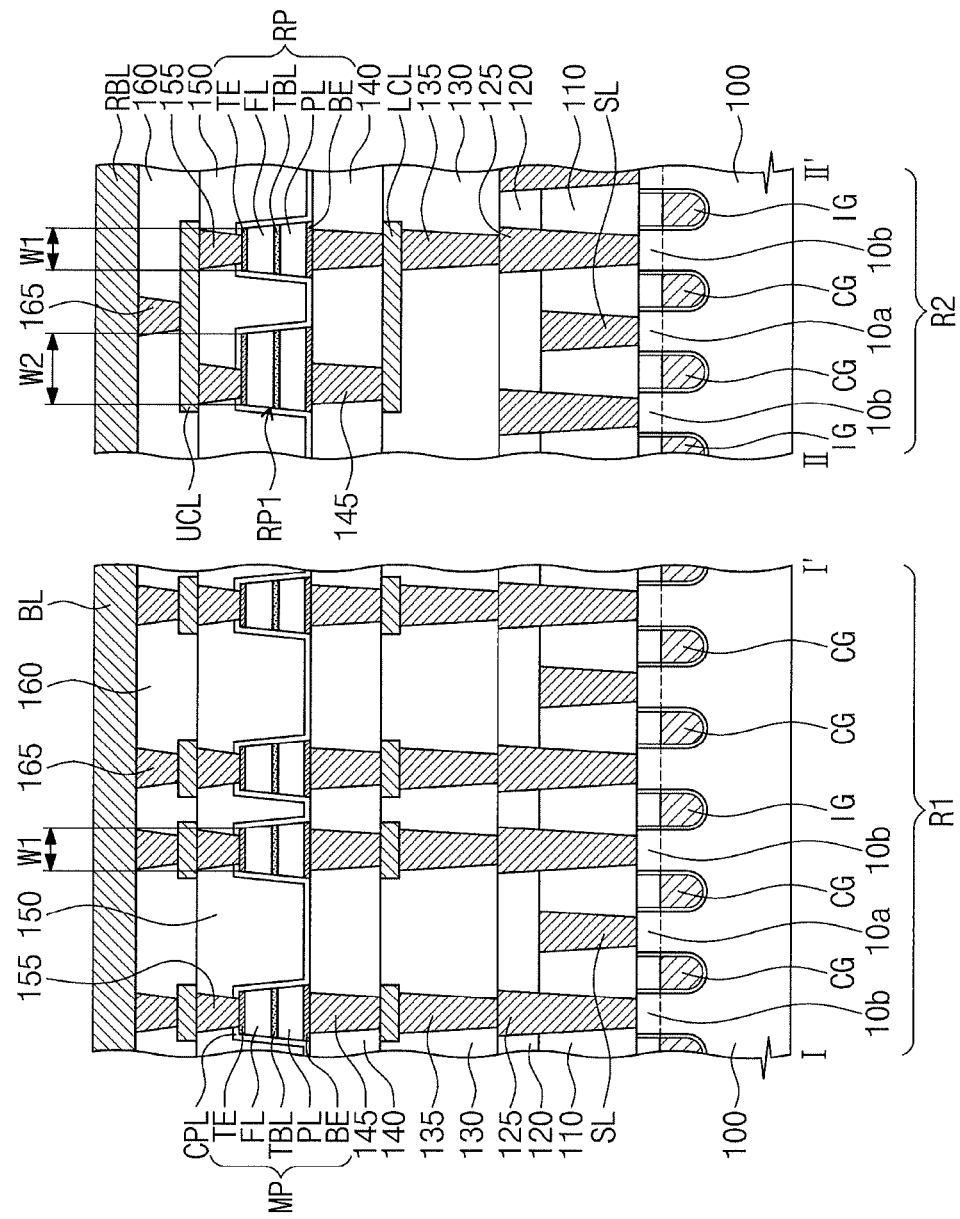
FIG. 9 is a cross-sectional view taken along lines I-I' and II-II' of FIG. 8 illustrating a semiconductor memory device according to exemplary embodiments of the present inventive concept.

FIG. 8 is a plan view illustrating a semiconductor memory device according to exemplary embodiments of the present inventive concept. FIG. 9 is a cross-sectional view taken along lines I-I' and II-II' of FIG. 8 illustrating a semiconductor memory device according to exemplary embodiments of the present inventive concept. For brevity of the description, components substantially the same as those discussed above with reference to FIGS. 5 and 6 are allocated the same reference numerals thereto, and a repetitive description thereof will be omitted.

Referring to FIGS. 8 and 9, the semiconductor substrate 100 may be provided to include the memory cell array region R1 and the reference cell array region R2. Memory cell select transistors may be disposed on the memory cell array region R1, and reference cell select transistors may be disposed on the reference cell array region R2.

On the memory cell array regions R1, the memory MTJ patterns MP may be electrically connected to the second impurity regions 10b through the contact plugs 125, 135 and 145. Each of the memory MTJ patterns MP may include the bottom electrode BE, the pinned layer PL, the tunnel barrier layer TBL, the free layer FL, and the top electrode TE that are sequentially stacked. Each of the memory MTJ patterns MP may have a first upper width W1.

In some embodiments, the first and second reference MTJ patterns RP1 and RP2 may be disposed on the reference cell array region R2. The first reference MTJ pattern RP1 may have a second upper width W2 greater than the first upper width W1, and the second reference MTJ pattern RP2 may have a first upper width W1 substantially the same as the those of the memory MTJ patterns MP.

In some embodiments, the bottom electrodes of the first and second reference MTJ patterns RP1 and RP2 may be electrically connected to each other through the lower interconnect line LCL and the contact plugs 145, and the top electrodes TE of the first and second reference MTJ patterns RP1 and RP2 may be electrically connected to each other through the upper interconnect line UCL and the contact plugs 155. The lower interconnect line LCL may be electrically connected to one of the second impurity regions 10b on the reference cell array region R2 through the buried contact plug 125 and the lower contact plug 135. The upper interconnect line UCL may be electrically connected through the upper contact plug 165 to the reference bit line RBL.

Figure 10:
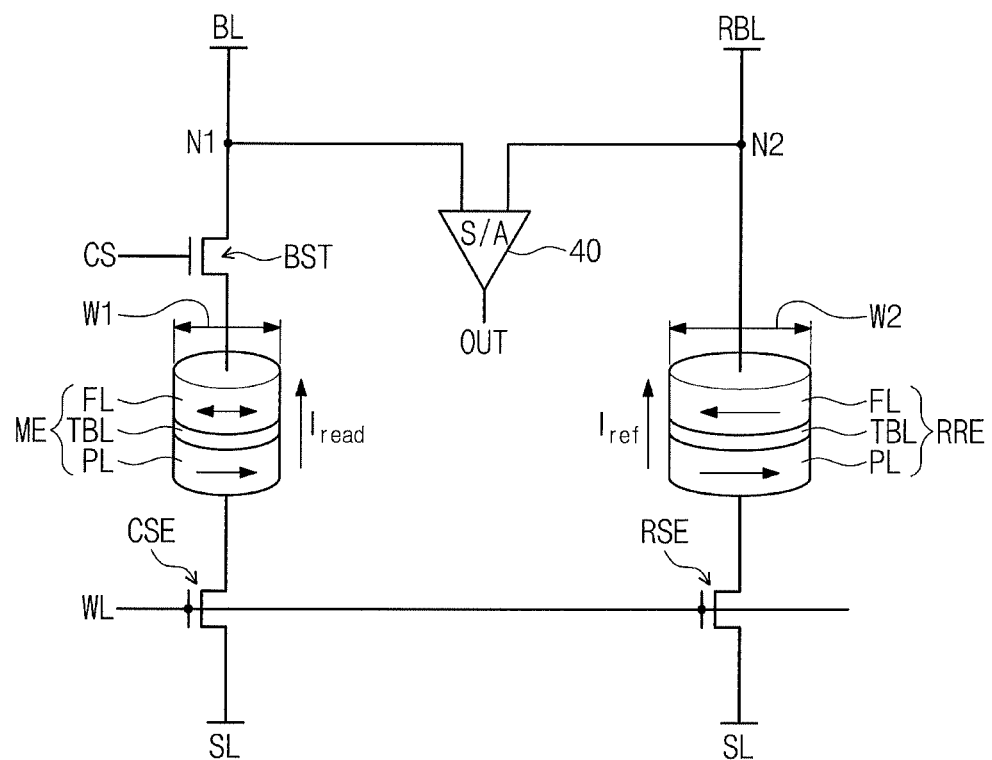
FIG. 10 is a schematic diagram illustrating a unit memory cell and a reference cell connected to a sense amplifier according to exemplary embodiments of the present inventive concept.

FIG. 10 is a schematic diagram illustrating a unit memory cell and a reference cell connected to the sense amplifier 40 according to exemplary embodiments of the present inventive concept. For brevity of the description, components substantially the same as those discussed above with reference to FIGS. 9A and 9B are allocated the same reference numerals thereto, and a repetitive description thereof will be omitted.

Referring to FIG. 10, the memory element ME may be connected between the first sensing node N1 and the cell select element CSE, and the reference resistance element RRE may be connected between the second sensing node N2 and the reference cell select element RSE.

The memory element ME may be connected through the first sensing node N1 to the sense amplifier 40 in accordance with the bit line select signal CS. As discussed above, the memory element ME may be a variable resistance element that includes the magnetic tunnel junction having a first width or diameter W1. The magnetic tunnel junction of the memory element ME may have a first resistance value or a second resistance value greater than the first resistance value.

In some embodiments, the reference resistance element RRE may be composed of a single reference MTJ. The reference MTJ RRE may have a second width or diameter W2 greater than the first width or diameter W1 of the memory element ME, and may include the free layer FL and the pinned layer PL whose magnetization directions are fixed anti-parallel. The reference MTJ RRE may have a reference resistance value greater than the first resistance value of the magnetic tunnel junction of the memory element ME and less than the second resistance value of the magnetic tunnel junction of the memory element ME.

Figure 11:
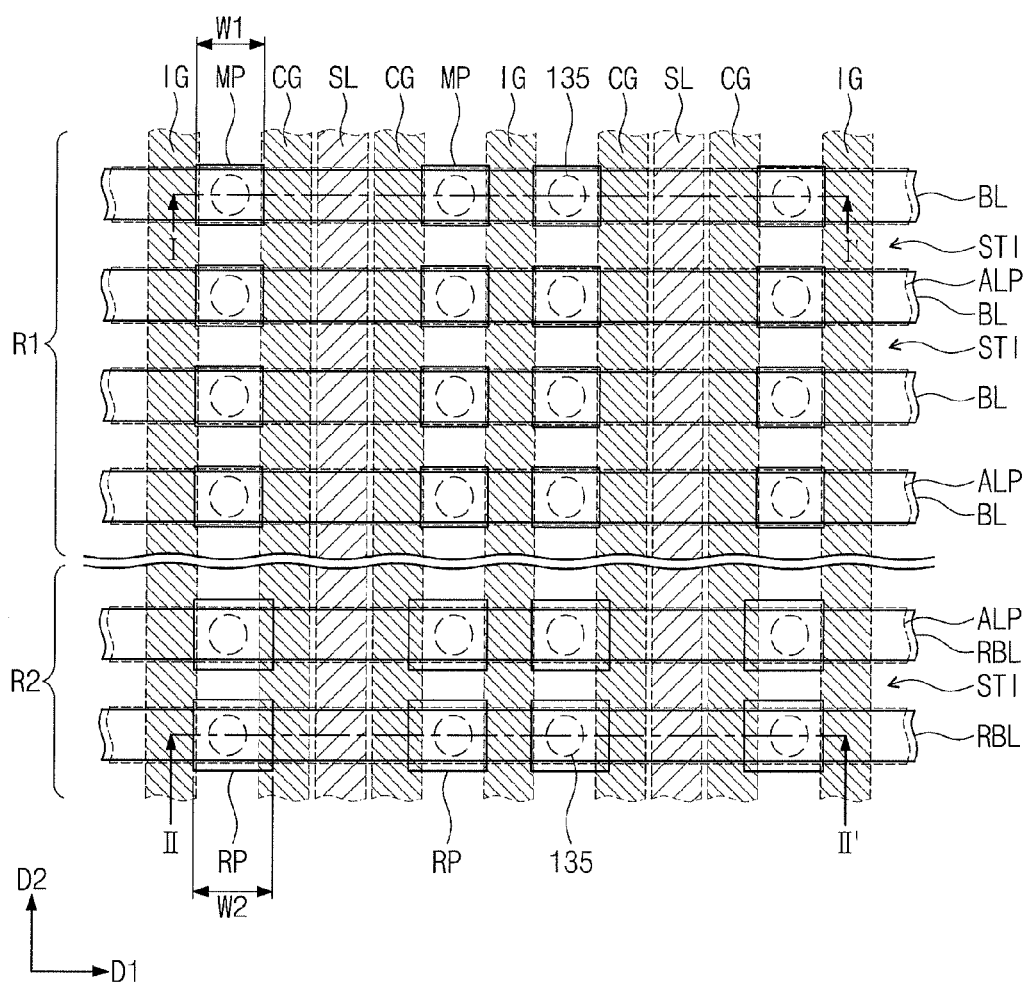
FIG. 11 is a plan view illustrating a semiconductor memory device according to exemplary embodiments of the present inventive concept.
Figure 12:
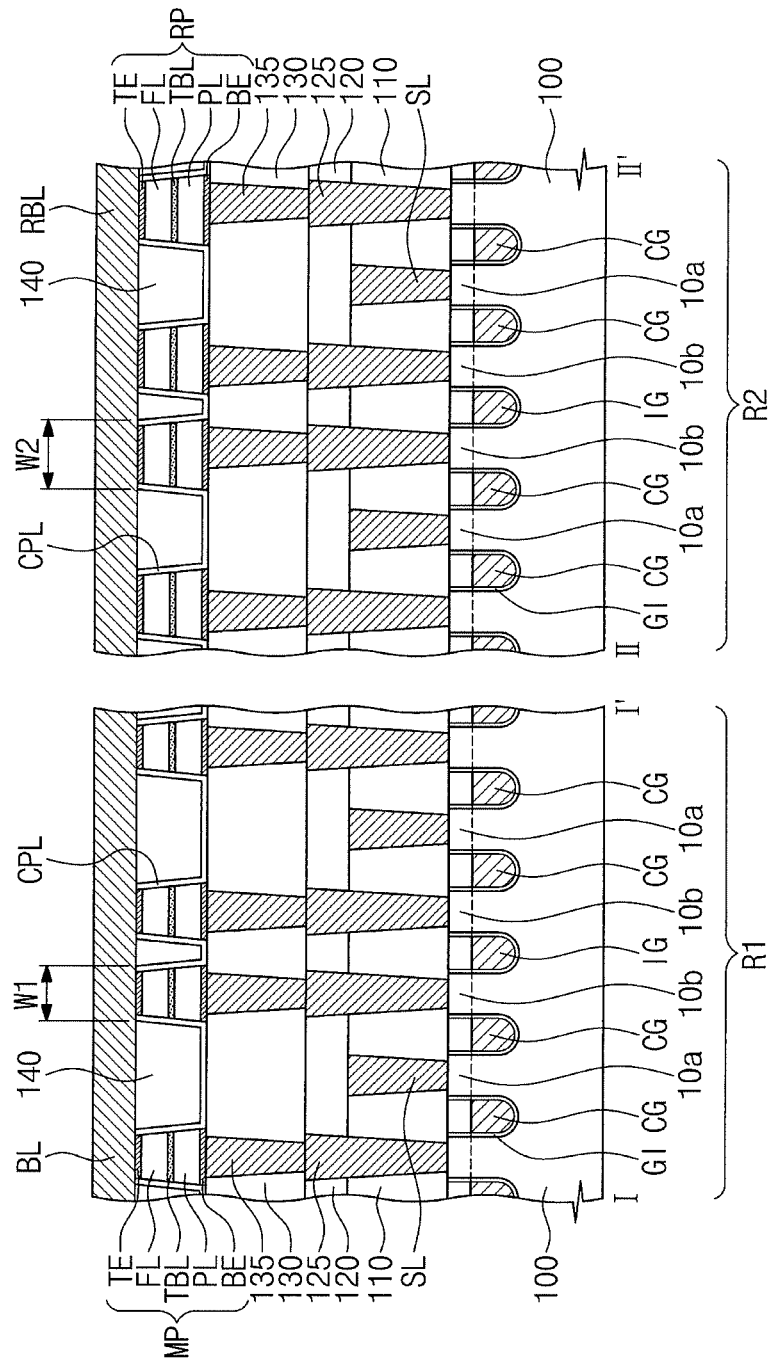
FIG. 12 is a cross-sectional view taken along lines I-I' and II-II' of FIG. 11 illustrating a semiconductor memory device according to exemplary embodiments of the present inventive concept.

FIG. 11 is a plan view illustrating a semiconductor memory device according to exemplary embodiments of the present inventive concept. FIG. 12 is a cross-sectional view taken along lines I-I' and II-II' of FIG. 11 illustrating a semiconductor memory device according to exemplary embodiments of the present inventive concept.

For brevity of the description, components substantially the same as those discussed above with reference to FIGS. 5 and 6 are allocated the same reference numerals thereto, and a repetitive description thereof will be omitted.

Referring to FIGS. 11 and 12, the semiconductor substrate 100 may be provided to include the memory cell array region R1 and the reference cell array region R2. As discussed above, memory cell select transistors may be disposed on the memory cell array region R1, and reference cell select transistors may be disposed on the reference cell array region R2.

On the memory cell array regions R1, the memory MTJ patterns MP may be electrically connected to the second impurity regions 10b through the buried and lower contact plugs 125 and 135. As viewed in plan, the memory MTJ patterns MP may be two-dimensionally arranged along the first and second directions D1 and D2. Each of the memory MTJ patterns MP may include the bottom electrode BE, the pinned layer PL, the tunnel barrier layer TBL, the free layer FL, and the top electrode TE that are sequentially stacked. Each of the memory MTJ patterns MP may have a first upper width W1.

In some embodiments, on the reference cell array regions R2, the reference MTJ patterns RP may be electrically connected to the second impurity regions 10b through the buried and lower contact plugs 125 and 135. Similarly to the memory MTJ patterns MP, the reference MTJ patterns RP may be two-dimensionally arranged along the first and second directions D1 and D2.

Each of the reference MTJ patterns RP may have the same stack structure as the memory MTJ patterns MP, and may have a second upper width W2 greater than the first upper width W1 of the memory MTJ patterns MP. Each of the reference MTJ patterns RP may have a reference resistance value greater than the first resistance of the memory MTJ pattern MP and less than the second resistance value of the memory MTJ pattern MP.

Figure 13:
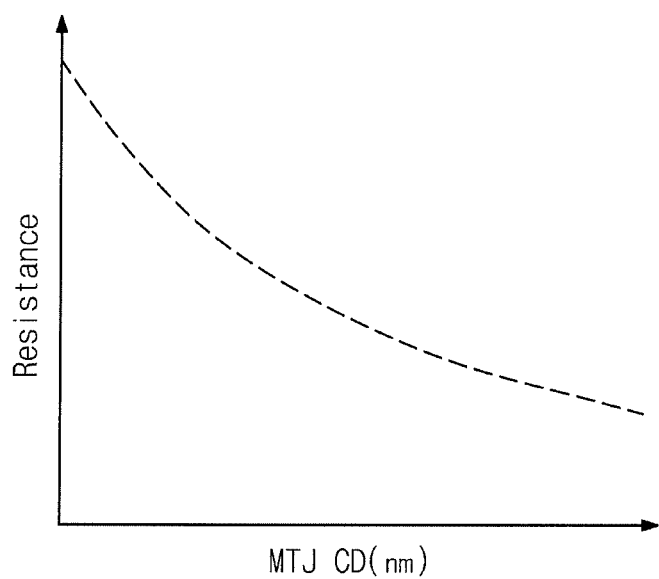
FIG. 13 is a graph showing how resistance characteristics of a magnetic tunnel junction depend on a size of the magnetic tunnel junction in a semiconductor memory device according to exemplary embodiments of the present inventive concept.

FIG. 13 is a graph showing how resistance characteristics of a magnetic tunnel junction depend on a size of the magnetic tunnel junction in a semiconductor memory device according to exemplary embodiments of the present inventive concept.

Referring to FIG. 13, the magnetic tunnel junction may have a resistance value that varies depending on its diameter (or width) CD and decreases as increasing of the diameter CD (or width).

In some embodiments, the width (or diameter) of the reference MTJ pattern may be determined by the width and TMR characteristics of the memory MTJ patterns MP. The width (or diameter) of the reference MTJ pattern may be selected such that the reference MTJ pattern may have a reference resistance value between the first and second resistance values of the memory MTJ pattern.

Figure 14:
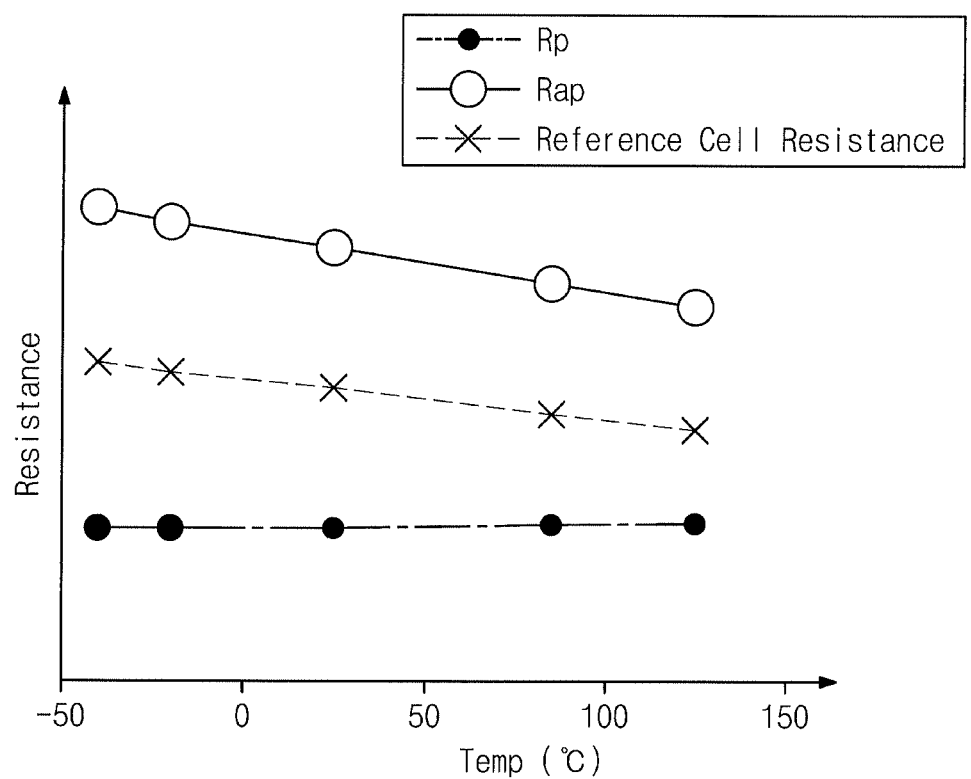
FIG. 14 is a graph showing how resistance characteristics of a magnetic tunnel junction depend on an operating temperature for a semiconductor memory device according to exemplary embodiments of the present inventive concept.

FIG. 14 is a graph showing how resistance characteristics of a magnetic tunnel junction depending on an operating temperature for a semiconductor memory device according to exemplary embodiments of the present inventive concept. In FIG. 14, Rp indicates resistance characteristics exhibited on the magnetic tunnel junction in the parallel state, and Rap denotes resistance characteristics exhibited on the magnetic tunnel junction in the anti-parallel state.

Referring to FIG. 14, the magnetic tunnel junction may have a resistance value that varies depending on an operating temperature. When a semiconductor memory device experiences increase in its operating temperature, heat energy may be provided to spins in the magnetic tunnel junction, and thus the tunnel barrier layer may be passed through by the heat-energized spins having directions opposite the magnetization direction of the pinned layer. Accordingly, a decrease in the resistance value may be observed on the magnetic tunnel junction in the anti-parallel state. This result may demonstrate that, in comparison with the magnetic tunnel junction in the parallel state, the magnetic tunnel junction in the anti-parallel state may have a greater variation in the resistance value due to increase in the operating temperature of a semiconductor memory device.

In some embodiments, as the reference resistance element is composed of the magnetic tunnel junction in the anti-parallel state, when a semiconductor memory device is operated, the reference resistance value of the reference resistance element may vary in proportion to variation in the resistance value, which is changed depending on the operating temperature, of the magnetic tunnel junction of the memory cells. Therefore, a data read operation may be stably performed without any temperature compensation circuit for compensating the reference resistance value of the reference resistance element in accordance with the change of the operating temperature of a semiconductor memory device.

FIGS. 15A to 15F are cross-sectional views illustrating various magnetic tunnel junction patterns of a semiconductor memory device according to exemplary embodiments of the present inventive concept. In some embodiments, the reference MTJ patterns may also have substantially the same stack structure as the memory MTJ patterns shown in FIGS. 15A to 15F.

Referring to FIGS. 15A to 15E, the memory MTJ pattern MP may include a pinned layer PL, a free layer FL, and a tunnel barrier layer TBL therebetween. The memory MTJ pattern MP may further include a bottom electrode BE and a top electrode TE, and the pinned layer PL, the free layer FL, and the tunnel barrier layer TBL may be disposed between the bottom and top electrodes BE and TE.

Figure 15A:
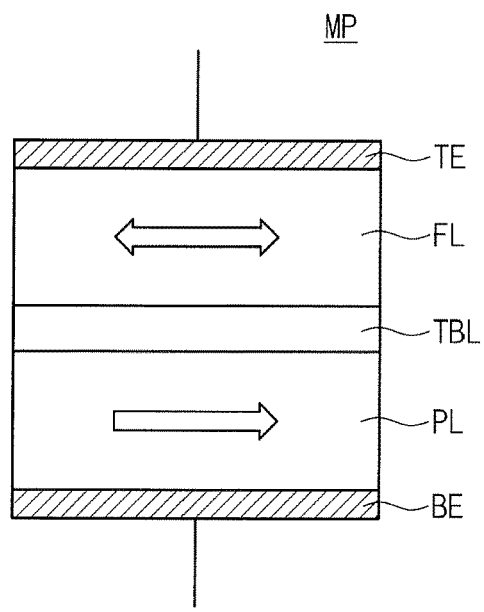
FIGS. 15A to 15F are schematic diagrams illustrating various magnetic tunnel junction patterns of a semiconductor memory device according to exemplary embodiments of the present inventive concept.
Figure 15B:
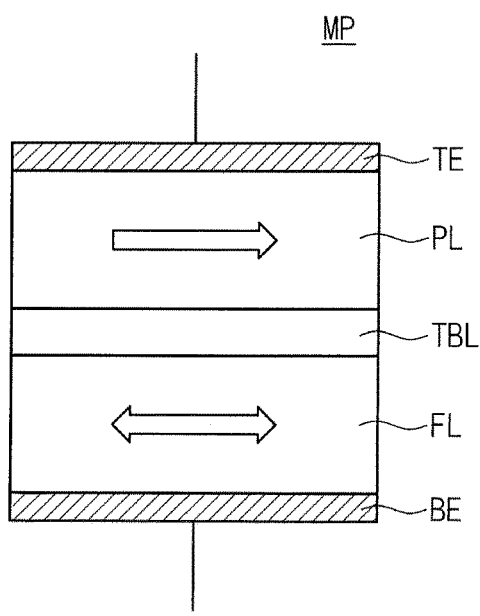

As shown in FIG. 15A, the pinned layer PL may be disposed between the bottom electrode BE and the tunnel barrier layer TBL, and the free layer FL may be disposed between the top electrode TE and the tunnel barrier layer TBL. Alternatively, as shown in FIG. 15B, the free layer FL may be disposed between the bottom electrode BE and the tunnel barrier layer TBL, and the pinned layer PL may be disposed between the top electrode TE and the tunnel barrier layer TBL. Referring together to FIGS. 15A and 15B, magnetization directions of the pinned and free layers PL and FL may be parallel to a top surface of the tunnel barrier layer TBL.

The pinned and free layers PL and FL may include a ferromagnetic material. The pinned layer PL may further include an anti-ferromagnetic material for pinning a magnetization direction of the ferromagnetic material in the pinned layer PL. The tunnel barrier layer TBL may include at least one of magnesium oxide, titanium oxide, aluminum oxide, magnesium-zinc oxide, or magnesium-boron oxide. The bottom and top electrodes BE and TE may include conductive metal nitride (e.g., titanium nitride, tantalum nitride, and/or tungsten nitride).

Figure 15C:
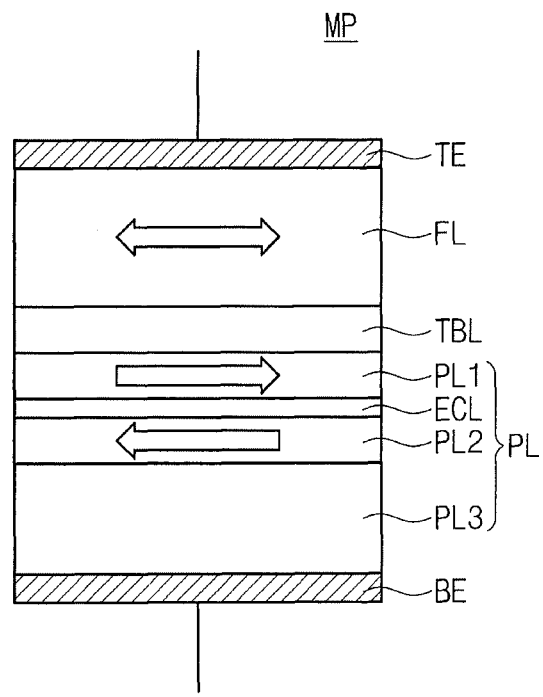

According to the embodiment shown in FIG. 15C, the pinned layer PL of the memory MTJ pattern MP may include a first pinned layer PL1, an exchange coupling layer ECL, a second pinned layer PL2, and a pinning layer PL3.

The first pinned layer PL1 may be in direct contact with the tunnel barrier layer TBL, and the second pinned layer PL2 may be in direct contact with the pinning layer PL3. The pinning layer PL3 may cause the second pinned layer PL2 to have a unidirectionally fixed magnetization direction. The exchange coupling layer ECL may cause the first pinned layer PL1 to have a magnetization direction fixed anti-parallel to the magnetization direction of the second pinned layer PL2.

The first pinned layer PL1 may include a ferromagnetic material. For example, the first pinned layer PL1 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), or cobalt-iron-nickel (CoFeNi). In some embodiments, a magnetic material of the second pinned layer PL2 may include iron (Fe). For example, the magnetic material of the second pinned layer PL2 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), or cobalt-iron-nickel (CoFeNi). The cobalt-iron-terbium (CoFeTb) may contain a terbium (Tb) content ratio of less than about 10% so as to have a magnetization direction parallel to a top surface of the free layer FL. Similarly, the cobalt-iron-gadolinium (CoFeGd) may contain a gadolinium (Gd) content ratio of less than about 10% so as to have a magnetization direction parallel to the top surface of the free layer FL.

The exchange coupling layer ECL may include a rare metal. For example, the exchange coupling layer ECL may include at least one of ruthenium (Ru), iridium (Ir), or rhodium (Rh).

The pinning layer PL3 may include an anti-ferromagnetic material. For example, the pinning layer PL3 may include at least one of platinum-manganese (PtMn), iridium-manganese (IrMn), manganese oxide (MnO), manganese sulfide (MnS), manganese-tellurium (MnTe), or manganese fluoride (MnF).

Figure 15D:
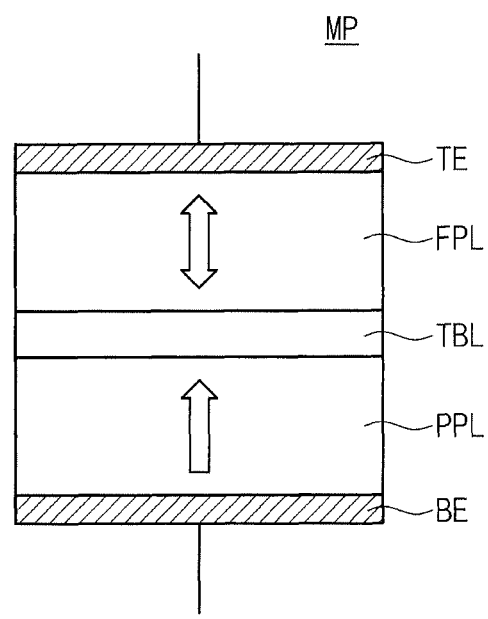
Figure 15E:
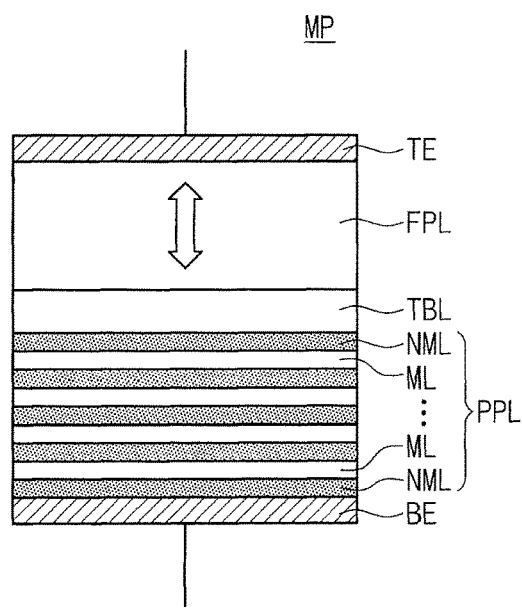

According to the embodiments shown in FIGS. 15D and 15E, the memory MTJ pattern MP may include a pinned perpendicular magnetic layer PPL, a free perpendicular magnetic layer FPL, and a tunnel barrier layer TBL therebetween. The pinned perpendicular magnetic layer PPL may have a unidirectionally fixed magnetization direction, and the free perpendicular magnetic layer FPL may have a magnetization direction that can be changed parallel or anti-parallel to the magnetization direction of the pinned perpendicular magnetic layer PPL. The magnetization directions of the pinned and free perpendicular magnetic layers PPL and FPL may be substantially perpendicular to a top surface of the tunnel barrier layer TBL. The pinned perpendicular magnetic layer PPL, the tunnel barrier layer TBL, and the free perpendicular magnetic layer FPL may be sequentially disposed between the bottom and top electrodes BE and TE. Alternatively, the pinned perpendicular magnetic layer PPL and the free perpendicular magnetic layer FPL may be reversely disposed with respect to each other.

In the memory MTJ pattern MP shown in FIG. 15D, the pinned and free perpendicular magnetic layers PPL and FPL may include a perpendicular magnetic material (e.g., CoFeTb, CoFeGd, CoFeDy), a perpendicular magnetic material having an $L1_0$ structure, or CoPt of hexagonal close-packed lattice structure. The perpendicular magnetic material having the $L1_0$ structure may include at least one of FePt of the $L1_0$ structure, FePd of the $L1_0$ structure, CoPd of the $L1_0$ structure, or CoPt of the $L1_0$ structure. The pinned perpendicular magnetic layer PPL may be thicker than the free perpendicular magnetic layer FPL, and/or may have a coercive force greater than that of the free perpendicular magnetic layer FPL. The tunnel barrier layer TBL may include at least one of magnesium oxide, titanium oxide, aluminum oxide, magnesium-zinc oxide, or magnesium-boron oxide.

According to the embodiment shown in FIG. 15E, the pinned perpendicular magnetic layer PPL of the memory MTJ pattern MP may include at least one magnetic layer ML and at least one non-magnetic layer NML that are alternately stacked.

The magnetic layers ML may be formed of a ferromagnetic material, and the non-magnetic layers NML may be formed of oxide. For example, the magnetic layers ML may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), or cobalt-iron-nickel (CoFeNi).

The non-magnetic layers NML may be formed in direct contact with the magnetic layers ML, and this direct contact may cause the magnetic layers ML to change their magnetization directions parallel to a thickness direction thereof, i.e., parallel to a normal direction of main surfaces of the magnetic layers ML. That is, the non-magnetic layers NML may provide the magnetic layers ML with an external factor that allows the magnetic layers ML having an intrinsic in-plane magnetization property to exhibit perpendicular magnetization characteristics. For example, the non-magnetic layers NML may include at least one of magnesium oxide, tantalum oxide, titanium oxide, aluminum oxide, magnesium-zinc oxide, hafnium oxide, or magnesium-boron oxide. The non-magnetic layers NML may have resistivity greater than that of the magnetic layers ML. The non-magnetic layers NML may be thinner than the magnetic layers ML.

An uppermost non-magnetic layer NML may be in direct contact with the tunnel barrier layer TBL. Alternatively, a perpendicular magnetization preserve pattern (not shown) may be interposed between the uppermost non-magnetic layer NML and the tunnel barrier layer TBL. The perpendicular magnetization preserve pattern (not shown) may be formed of a material whose resistivity is less than that of the non-magnetic layers NML. For example, the perpendicular magnetization preserve pattern (not shown) may be formed of at least one of copper or noble metal (e.g., ruthenium, rhodium, palladium, silver, osmium, iridium, platinum, or gold).

Figure 15F:
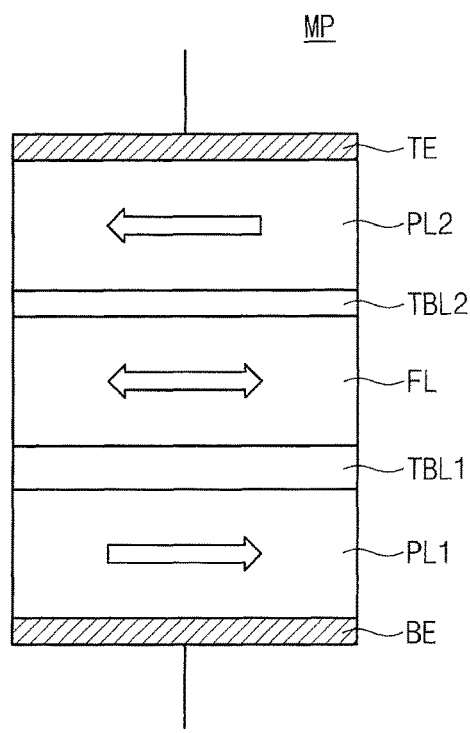

According to the embodiment shown in FIG. 15F, the memory MTJ pattern MP may include a first pinned layer PL1, a first tunnel barrier layer TBL1, a free layer FL, a second tunnel barrier layer TBL2, and a second pinned layer PL2. The first and second tunnel barrier layers TBL1 and TBL2 may have thicknesses different from each other. The memory MTJ pattern MP may include a first magnetic tunnel junction pattern consisting of the first pinned layer PL1, the first tunnel barrier layer TBL1, and the free layer FL. The memory MTJ pattern MP may further include a second magnetic tunnel junction consisting of the second tunnel barrier layer TBL2 and the second pinned layer PL2.

The first and second pinned layers PL1 and PL2 may have unidirectionally fixed magnetization directions, which may be anti-parallel to each other. The free layer FL may have a magnetization direction that can be changed parallel or anti-parallel to the fixed magnetization directions of the first and second pinned layers PL1 and PL2. The magnetization directions of the pinned and free layers PL1, PL2 and FL may be substantially parallel or perpendicular to top surfaces of the first and second tunnel barrier layers TBL1 and TBL2.

The memory MTJ pattern MP may include a bottom electrode BE and a top electrode TE, all of which may be formed of conductive metal nitride. The bottom and top electrodes BE and TE may be provided therebetween with the first pinned layer PL1, the first tunnel barrier layer TBL1, the free layer FL, the second tunnel barrier layer TBL2, and the second pinned layer PL2 that are sequentially disposed.

According to exemplary embodiments of the present inventive concept, the semiconductor memory device may include the reference cell consisting of the reference magnetic tunnel junctions MTJ in the anti-parallel state. In this configuration, as characteristics of the reference MTJs and the memory MTJs are simultaneously changed in accordance with the operating temperature when the semiconductor memory device is operated, the reference resistance may be stably provided without any temperature compensation circuit for the reference cell.

Moreover, as the reference MTJs constituting the reference cell are all in the anti-parallel state, it may be possible to reduce that the unidirectional reference current affects spins in the reference MTJs. As a result, the reference current may be prevented from varying depending on variation in characteristics of one of the reference MTJs constituting the reference cell.

Although the present invention has been described in connection with the embodiments of the present invention illustrated in the accompanying drawings, it will be understood to those skilled in the art that various changes and modifications may be made without departing from the technical spirit and essential feature of the present invention. It thus should be understood that the above-described embodiments are not limiting but illustrative in all aspects.

What is claimed is:

1. A semiconductor memory device comprising:
   a memory cell configured to be coupled to a first sensing node and including a memory MTJ programmable to first and second resistance states;
   a reference cell configured to be coupled to a second sensing node and comprising a first reference MTJ having the second resistance state and second and third reference MTJs connected in series between first and second terminals of the first reference MTJ and each having the second resistance state; and
   a sensing circuit configured to be coupled to the first and second sensing nodes and to detect a difference in resistance between the memory cell and the reference cell.

2. The semiconductor memory device of claim 1, wherein each of the memory MTJ and the first, second and third reference MTJs comprises:
   a first magnetic layer;
   a second magnetic layer; and
   a tunnel barrier layer between the first and second magnetic layers.

3. The semiconductor memory device of claim 2, wherein each of the first, second and third reference MTJs has substantially the same structure and size as the memory MTJ.

4. The semiconductor memory device of claim 1, wherein each of the memory MTJ and the first, second and third reference MTJs has an upper width less than its lower width, and wherein the upper width of each of the first, second and third reference MTJs is substantially the same as the upper width of the memory MTJ.

5. The semiconductor memory device of claim 1, wherein each of the first, second and third reference MTJs comprises:
   a pinned layer having a fixed magnetization direction;

a free layer having a changeable magnetization direction; and a tunnel barrier layer between the pinned layer and the free layer, wherein the magnetization directions of the pinned layer and the free layer are in an anti-parallel state.

6. The semiconductor memory device of claim 1, further comprising a memory cell select element connected to the memory MTJ and a reference cell select element connected to the reference cell and wherein the cell select element and the reference cell select element are controlled by a common word line.

7. The semiconductor memory device of claim 1, wherein the memory MTJ and the first, second and third reference MTJs are spin transfer torque (STT) MTJs.

* * * * *